United States Patent [19]

Holzmann et al.

[11] 4,251,805
[45] Feb. 17, 1981

[54] CIRCUIT ARRANGEMENT FOR AN INPUT KEYBOARD

[75] Inventors: Dieter Holzmann, Freiburg-Munzingen; Joachim Grosse, Breisach-Guendlingen, both of Fed. Rep. of Germany

[73] Assignee: ITT Industries, Inc., New York, N.Y.

[21] Appl. No.: 969,050

[22] Filed: Dec. 13, 1978

[30] Foreign Application Priority Data

Dec. 17, 1977 [DE] Fed. Rep. of Germany ....... 2756327

[51] Int. Cl.³ .................................................. G06F 3/02
[52] U.S. Cl. ............................. 340/365 S; 340/365 R
[58] Field of Search ............ 340/365 R, 365 E, 365 S; 178/17 C, 17 A; 179/90 K; 400/472, 479

[56] References Cited

U.S. PATENT DOCUMENTS

| | | | |
|---|---|---|---|
| 3,456,077 | 7/1969 | Jones | 340/365 S |
| 3,717,871 | 2/1973 | Hatano et al. | 340/365 S |
| 4,074,262 | 2/1978 | Nomiya et al. | 340/365 S |
| 4,099,177 | 7/1978 | Maekawa et al. | 340/365 S |
| 4,138,916 | 2/1979 | Kitagawa | 340/365 S |

FOREIGN PATENT DOCUMENTS

| | | | |
|---|---|---|---|
| 1320479 | 6/1973 | United Kingdom . | |
| 1334063 | 10/1973 | United Kingdom . | |
| 1455215 | 11/1976 | United Kingdom | 340/365 S |
| 1482304 | 8/1977 | United Kingdom . | |

OTHER PUBLICATIONS

IBM Technical Disclosure Bulletin, "Keyboard Scanning", Beausoleil et al., Oct. 1966, pp. 532–533.
Motorola "Semiconductor Data Library", vol. 5, series B, 1976, pp. 5–201 to 5–204.
"Motorola Semiconductors", No. E-175, Jun. 1976.
*Electronics,* Jan. 1977, pp. 110–112, "Chip Scans Keyboard . . .", Hammond.

*Primary Examiner*—James J. Groody
*Attorney, Agent, or Firm*—John T. O'Halloran; Peter C. Van Der Sluys

[57] ABSTRACT

A keyboard switch matrix has a plurality of column and row wires and switches having only two poles and no interconnecting diodes for selectively connecting one of said columns to one of said rows. Associated with each column and row wire is a flip-flop having a set input connected to the wire and an electronic switch for each flip-flop connecting a flip-flop output to the set input. The outputs of the row flip-flops are connected to a NOR-gate, the output of which is connected to a control input of the electronic switches associated with the column flip-flops and also to a second set input of the column flip-flops. The output of the NOR-gate is further connected to a control input of the electronic switches associated with the row flip-flops through an inverter. Reset inputs of the column flip-flops are connected to the NOR-gate output through a differentiation circuit which is triggered by a negative pulse edge. A second NOR-gate has its inputs connected to the column wires and provides an output to a differentiation circuit which is triggered by a positive pulse edge. The output of the differentiation circuit is connected to reset inputs of the row flip-flops. Thus, the geometric position of the actuated keyboard switch is stored in the respective row and column flip-flops, and code signals corresponding to said position are provided at the outputs of said flip-flops.

12 Claims, 20 Drawing Figures

CIRCUIT ARRANGEMENT FOR AN INPUT KEYBOARD

BACKGROUND OF THE INVENTION

This invention relates in general to a circuit arrangement for an input keyboard and more particularly to an electronic circuit for a keyboard switch matrix, the switches of which have only two poles and no interconnecting diodes.

DESCRIPTION OF THE PRIOR ART

Electronic equipment is controlled in many cases via an input keyboard which, as a rule, consists of key switches arranged in rows and columns. As such equipment there are known, e.g., electronic calculating machines (computers), electronic pocket calculators or remote control arrangements for e.g., phonographs, radio or television receivers. The key switches, when actuated, serve to establish electrical connections between input leads which may be associated with the aforementioned rows and columns. Thus, in the technical journal "IBM Technical Disclosure Bulletin", October 1966, pp 532/33 there is described a keyboard circuit for data-processing systems in which the information, via the just depressed key switch, is represented in a three-out-of-eight code. The key switches as such, are simple bipolar switches acting as make contacts. Each such key switch is associated with four decoupling diodes connecting it with four of nine input leads of the data-processing system which, in turn, and with the aid of sampling signals, continuously interrogates the input keyboard in order thus to ascertain a depressed key switch. Accordingly, this arrangement operates in a dynamic technique.

In the technical journal "Electronic Engineering", September 1976, page 36 there is described another data-processing system whose input keyboard cooperates with the integrated circuit MC 14419 as described in the data book published by the firm of Motorola "Semiconductor Data Library", Volume 5, Series B, 1976, pp 5-201 to 5-204. From FIG. 4 of this publication it may be seen that the key switches must be equipped either with double contacts for connecting a supply voltage to the corresponding row or column lead, or that otherwise a key switch may be provided having a single contact when being connected to the respective column or row lead via two diodes. It is obvious that such an embodiment or such a circuitry of the key switches is more expensive than those of the key switches employing a single contact and mentioned in the aforementioned literature. The integrated circuit MC 14419 referred to, contains a two-out-of-eight encoder with a subsequently arranged code converter for a binary-coded decimal (BCD)-code. This circuit likewise operates in a dynamic technique, i.e. there is provided a timing signal oscillator for controlling the operating sequences in forming the code.

From a further data sheet published by Motorola Semiconductors, No. E 175, June 1976, there has become known the integrated circuit MC 14422 P realized in CMOS-technology, for remote control transmitters, which likewise operates in a dynamic technique and, for this purpose, contains a scanning oscillator, a scanning control circuit, and further, additional circuits. In this arrangement it is likewise possible to use single-pole-key switches. Finally, there is known from "Electronics", January 6, 1977, pp 110 to 112 an input keyboard employing single key switches in which the depressed key is ascertained with the aid of the micro-processor F8, for which the corresponding programme (software) is mentioned in the publication.

Accordingly, the two last-mentioned publications show arrangements which solve the keyboard encoding problem by involving an investment which, also with respect to integrated circuits, is relatively high Especially the last-mentioned publication proposing to use a commercially available micro-processor, is not realizable in cases, for example in the case of the aforementioned remote control, where, in one integrated circuit there is to be accommodated not only the keyboard encoding, but also the remaining remote control transmitter circuit. In such a case the keyboard encoding must do with as small as possible crystal surface, in order that sufficient crystal surface of the integrated circuit will remain to be left for the actual function of the remote control transmitter. Especially when looked at from this point of view it is rather out-of-the-way to provide a micro-processor, because essential parts thereof will remain unused. But also the aforementioned dynamic technique is too expensive for meeting the given requirement.

SUMMARY OF THE INVENTION

According to this invention a circuit arrangement for an input keyboard of electronic equipment comprises two-terminal key switches arranged in m columns and n rows, with each key switch, upon actuation, directly connecting a column lead associated with the respective column, to a row lead associated with the respective row, and the circuit arrangement, with respect to the columns, transmitting a one-out-of-m code signal and, with respect to the rows, a one-out-of-n-code signal, one row flip-flop each per row, comprising one reset and one set input which is connected to the respective row lead, one first make contact type electronic switch each per row flip-flop connecting the set input thereof to the output associated with this set input; a first NOR-gate having n inputs which are arranged at the output of each row flip-flop associated with the respective input; a first differentiating circuit whose input is connected to the output of the first NOR-gate, and which is triggered by a negatively directed pulse edge; an inverter stage whose input is connected to the output of the first NOR-gate, and whose output is connected to all control inputs of the first electronic switches; one column flip-flop each per column having one reset input and two set inputs not conditioning one another of which the first one is connected to the respective column lead and the second one is connected to the output of the first NOR-gate with the reset input being connected to the output of the first differentiating circuit one second make contact type electronic switch each per column flip-flop, connecting the first set input thereof to the output associated in common with the two set inputs, and whose control input is applied to the output of the first NOR-gate; a second NOR-gate having m inputs applied to the respective first set input of the column flip-flops; a second differentiating circuit whose input is connected to the output of the second NOR-gate, and whose output is connected to all reset inputs of the row flip-flops, triggered with the aid of a positively directed pulse edge, and a highly resistive termination, of each column lead.

It is an object of this invention to provide a circuit arrangement for input keyboards in which it is possible to use key switches having two terminals and without having to take additional decoupling measures, and in which the crystal surface necessary for the integration, is designed in accordance with the non-dynamic, hence the static technique.

With the circuit according to this invention it is possible to build also voluminous input keyboard switch matrices which may contain substantially more key switches than the prior art keyboards mentioned hereinbefore comprising a maximum of 16 key switches.

BRIEF DESCRIPTION OF THE DRAWINGS

This invention will now be explained in greater detail with reference to FIGS. 1 and 2 of the accompanying drawings, in which.

DETAILED DESCRIPTION OF THE INVENTION

Figure 1:
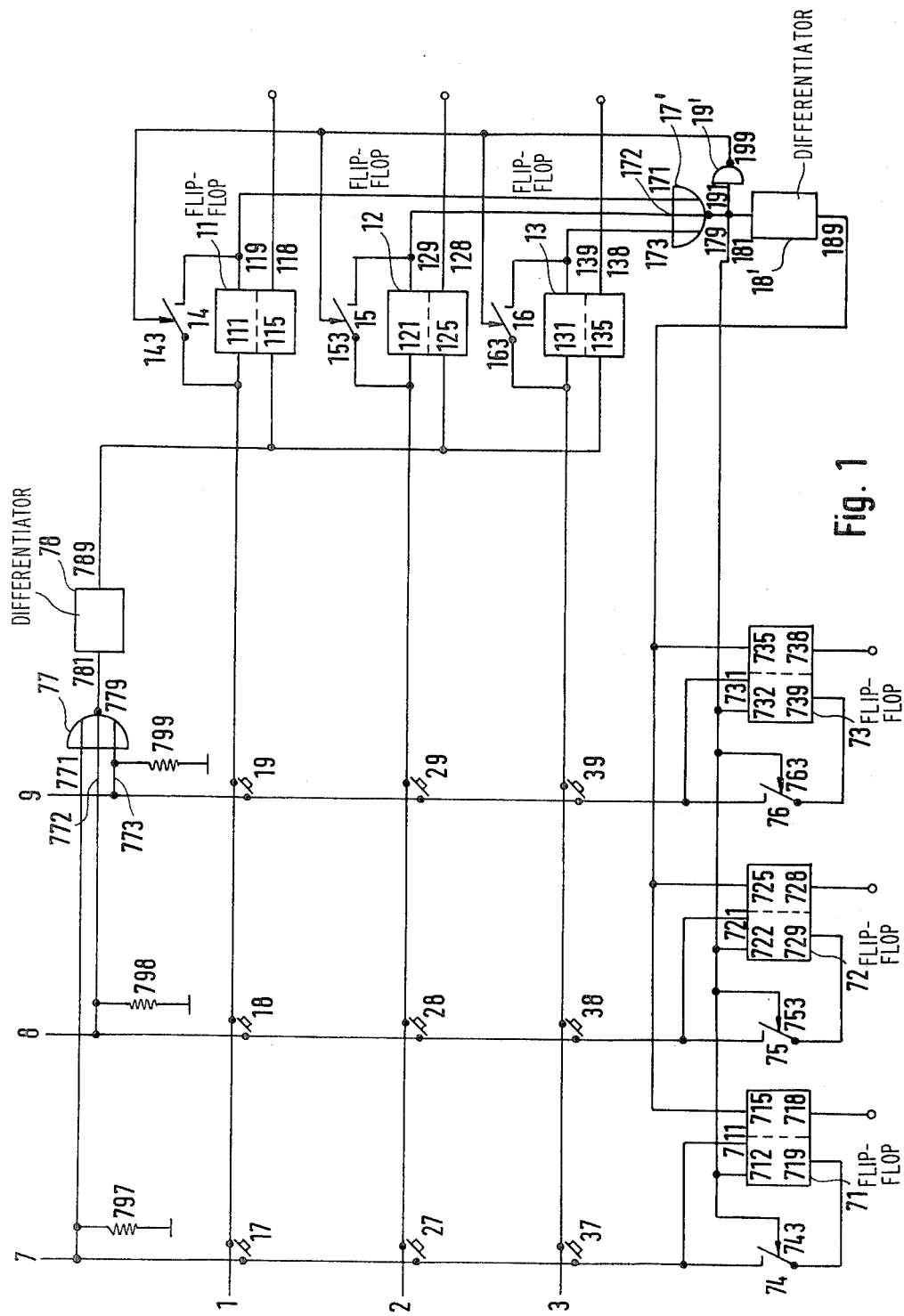
FIG. 1, in the form of a block diagram shows the basic principle of construction of the invention.

For the sake of simplicity and as an example of an embodiment, the block diagram according to FIG. 1 shows a three-by-three input keyboard, i.e., the number m of the column leads and the number n of the row leads each time equals three. The respective key switches 17, 18, 19; 27, 28, 29; 37, 38, 39 are arranged at each crosspoint of these leads, with these key switches, when actuated, directly connecting the corresponding column lead to the corresponding row lead.

The three row leads 1, 2, 3 and the three column leads 7, 8, 9 are respectively associated with one row flip-flop and a first electronic switch acting as a make contact, or with one column flip-flop and a second electronic switch acting as a make contact, respectively. Moreover, the column leads 7, 8, 9 are terminated in a highly resistive manner. Relative thereto, there are shown in the example of embodiment of FIG. 1 the resistors 797, 798, 799 as extending to the zero point of the circuit but which, however, may also extend to any other suitable potential. The high resistivity with respect to the resistance of the electronic switches must be safeguarded in their switched-on states.

Each of the set inputs 111, 121, 131 of the row flip-flops 11, 12, 13 is connected to the corresponding row lead 1, 2, 3 and is applied to the respective output 119, 129, 139 via a first electronic switch 14, 15, 16 each of which are controlled like a make contact, hence which are open when in the non-actuated state. Each of these outputs is the output associated with the set input, hence the Q-output of the row flip-flops, and connected with one of the inputs 171, 172, 173 of the first NOR-gate 17'. The number of inputs of this gate is equal to the number n of the row leads.

The output 179 of the first NOR-gate 17' is applied, on one hand, to the input 181 of the first differentiating circuit 18' whose output 189 extends to each reset input 715, 725, 735 of the column flip-flops 71, 72, 73 and, on the other hand, to the input 191 of the inverter stage 19' whose output 199 extends to each of the control inputs 143, 153, 163 of the first electronic switches 14, 15, 16 and finally to each second set input 712, 722, 732 of the column flip-flops 71, 72, 73 as well as to each control input 743, 753, 763 of the second electronic switches 74, 75, 76. Accordingly, these set and control inputs are all simultaneously controlled by the output signal of the first NOR-gate 17'.

Each column flip-flop 71, 72, 73 has two set inputs not conditioning one another. This can be achieved, for example, in that a conventional flip-flop, hence for example, an SR storage flip-flop, a JK flip-flop or the like is preceded with respect to one input by an OR-gate. Each first set input 711, 721, 731 is applied to one column lead 7, 8, 9 each, and, via the respective second electronic switch 74, 75, 76 which are likewise controlled like a make contact, hence are open when in the non-actuated state, applied to the respective output 719, 729, 739 associated with the two set inputs, which is the Q-output of the column flip-flop.

Each of these first set inputs and, consequently, also the column leads 7, 8, 9 are applied to each time one input of the second NOR-gate 77, the number of which is equal to the number m of column leads. The output 779 of the second-NOR-gate 77 is applied to the input 781 of the second differentiating circuit 78 whose output 789 is connected to each of the reset inputs 115, 125, 135 of the row flip-flops 11, 12, 13. As the first or second differentiating circuit 118' or 78 it is possible, for example, to use monostable multivibrators having a short metastable state, with the first differentiating circuit 18' only supposed to be triggered by a negatively directed pulse edge and the second differentiating circuit 78 only supposed to be triggered by a positiviely directed pulse edge.

The output signals in the aforementioned one-out-of-m-code or one-out-of-n-code may be taken off at the aforementioned Q-outputs or else invertedly in relation thereto, at the $\overline{Q}$-outputs 118, 128, 138; 718, 728, 738 of the row or column flip-flops respectively.

Figure 2:
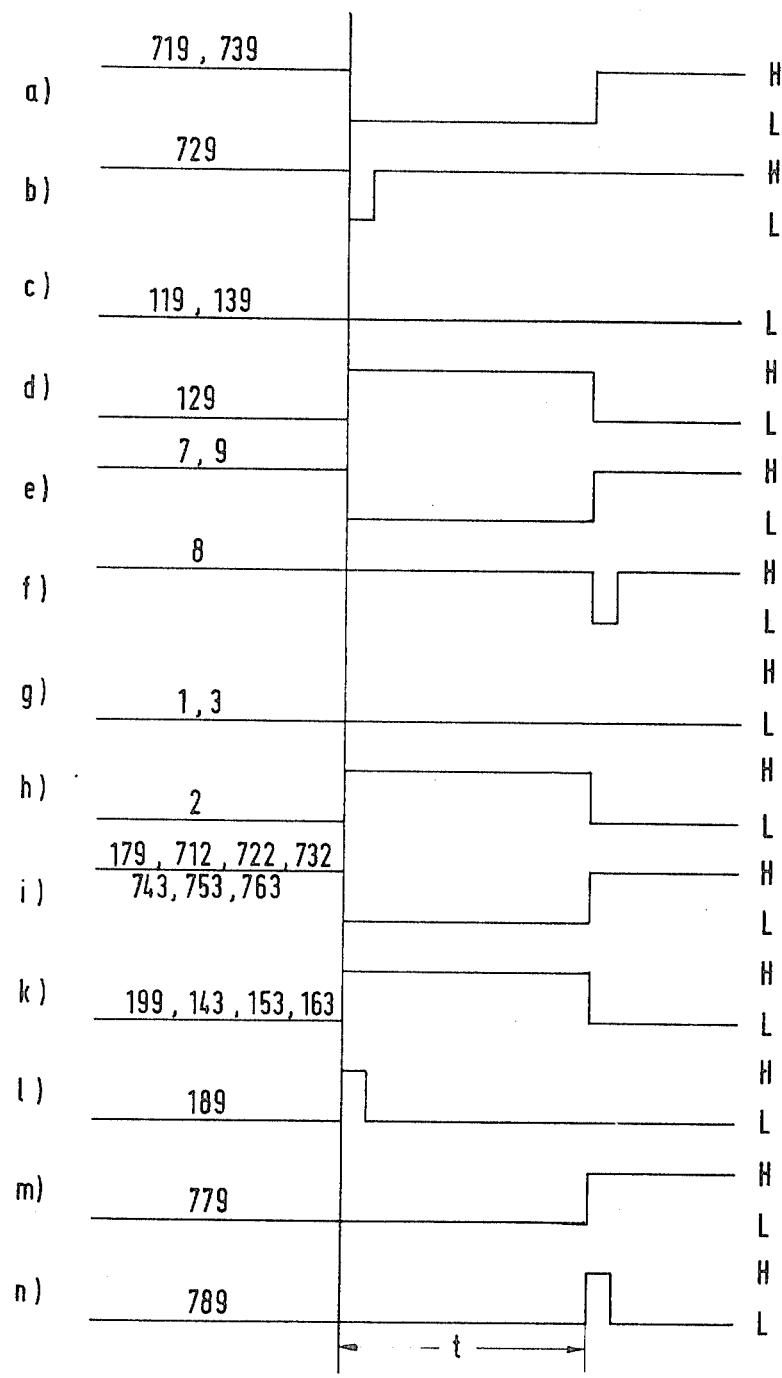
FIGS. 2a through 2n show various signal waveshapes occurring in the block diagram of FIG. 1.

FIG. 2 shows various waveshapes of signals as appearing during operation of the arrangement according to FIG. 1 in a positive logic, and which result from the following function description. Relative thereto, it is started out from the normal state in which all key switches 17, 27, 37; 18, 28, 38; 19, 29, 39 are in the non-actuated state. The signals occurring in the course of this are shown in FIG. 2 on the left of the vertical solid line. The Q-outputs 719, 729, 739 of the column flip-flops 71, 72, 73 each conduct an H-signal corresponding to a high potential, c.f. FIGS. 2a, 2b, and the Q-outputs 119, 129, 139 each conduct an L-signal corresponding to a lower potential, c.f. FIGS. 2c, 2d. Accordingly, one H-signal each is applied to the output 179 of the first NOR-gate 17' and to the control inputs 743, 753, 763 of the second electronic switches 74, 75, 76 as connected thereto, as well as to the first set inputs 711, 721, 731 of the column flip-flops 71, 72, 73, c.f. FIGS. 2e 2f so that the second electronic switches are closed and one H-signal each is applied to the column leads 7, 8, 9, c.f. FIGS. 2e, 2f. The H-signal at the output 179 of the NOR-gate 17', inverted into the L-signal, is applied to the control inputs 143, 153, 163 of the first electronic switches 14, 15, 16, c.f. FIG. 2k, so that these electronic switches are opened and, consequently one L-signal each is applied to the row leads 1, 2, 3, c.f. FIGS. 2g, 2h. The H-signals at the column leads 7, 8, 9 cause an L-signal to appear at the output 779 of the second NOR-gate 77, c.f. FIG. 2m. An L-signal is likewise applied to the outputs 189, 789 of the two differentiating circuits, c.f. FIGS. 2l, 2n.

Assuming now that the key switch 28 at the crosspoint of both the column lead 8 and the row lead 2 is depressed during the time t. In that case, the H-signal of the column lead 8 is applied via the row lead 2 to the set input 121 of the row flip-flop 12, and causes it to change states (c.f. FIG. 2h). At the Q-output 129 of the row flip-flop 12 the L-signal is changed into an H-signal, c.f. FIG. 2d, with this H-signal, via the first NOR-gate 17' and the inverter stage 19', closing the first electronic switches 14, 15, 16, c.f. FIG. 2k. Moreover, the H-signal at the Q-output 129 of the row flip-flop 12, inverted into the L-signal via the first NOR-gate 17', is applied to the second set inputs 712, 722, 732 of the column flip-flops 71, 72, 73 and to the control inputs 743, 753, 763 of the second electronic switches 74, 75, 76, thus causing the latter to be opened, c.f. FIG. 2i.

The H-L-signal inversion as appearing upon actuation of the key switch 28 at the output 179 of the first NOR-gate 17', representing a negatively directed pulse edge, serves to trigger the first differentiating circuit 18', so that this circuit will transmit a short H-pulse, c.f. FIG. 2l, by which the column flip-flops 71, 72, 73 are reset via their reset inputs 715, 725 735, thus causing the Q-outputs thereof each to assume one L-signal, c.f. FIGS. 2a, 2b.

Via the still depressed key 28 and the closed first electronic switch 15, the H-signal at the Q-output 129 of the row flip-flops 12 is applied to the first set input 721 of the column flip-flop 72, so that this flip-flop, upon disappearance of the reset signal at its reset input 725, is reset and, consequently, the Q-output 729 thereof again assumes an H-signal, c.f. FIG. 2b. Accordingly, of the column leads 7, 8, 9 only the column lead 8 still conducts an H-signal, because owing to the opening of the electronic switches 74, 75, 76, and across the highly resistive terminals 797, 779, the column leads 7, 9 have discharged and, consequently, conduct an L-signal c.f. FIG. 2e. Considering that the column lead 8 is now the only one to which an H-signal continues to be applied, c.f. FIG. 2f, the L-signal is maintained at the output 779 of the second NOR-gate 77, c.f. FIG. 2m.

Releasing the key 28 at the end of the period of time t causes the H-signal to disappear at the column lead 8 owing to a discharge across the highly resistant termination 798, c.f. FIG. 2f, and at the output 779 of the second NOR-gate 77, the L-signal is changed into an H-signal, c.f. FIG. 2m, with this L-H-signal inversion representing a positively directed pulse edge, triggering the second differentiation circuit 78, so that the latter will transmit a short H-pulse, c.f. FIG. 2n. Via the reset inputs 115, 125, 135, this pulse resets the row flip-flops 11, 12, 13 to their original states, so that the Q-outputs 119, 129, 139 re-assume the L-signal, thus re-establishing the original normal state.

The circuit arrangement according to this invention which, as the description has shown, works without a timing signal oscillator (clock pulse oscillator), can be realized in a particulary favorable way by employing the well-known CMOS-technology. In this case it lends itself in a particularly favorable way for being used in ultrasonic or infrared remote control units for phonographs, radio or television receivers. For other applications, the circuit arrangement according to this invention, however, may also be realized with the aid of other integrating technologies. For this purpose it is suitable, for example, to employ the MOS-technology, hence circuits employing insulated gate field-effect transistors of the same channel conductivity type, or else bipolar circuits, especially integrated injection logic ($I^2L$) circuits.

It will be evident to the person skilled in the art, that it is within the scope of this invention, by maintaining the same mode of operation, to change over from the positive logic as chosen in the example of embodiment, to a negative logic, in which case then, in the conventional way, the type of the employed gates, differentiating circuits and electronic switches, will have to be chosen in a correspondingly dual way. Moreover, in such a case, both the controlling of the flip-flops and the use of their outputs will have to be modified accordingly, with additionally required signal inversions having to be provided for by inserting further inverter stages at the corresponding points.

While we have described above the principles of our invention in connection with specific apparatus it is to be clearly understood that this description is made only by way of example and not as a limitation to the scope of our invention as set forth in the objects thereof and in the accompanying claims.

What is claimed is:

1. A circuit arrangement for an input keyboard of electronic equipment comprising two-terminal key switches arranged in m columns and n rows, with each key switch, upon actuation, directly connecting a column lead associated with the respective column, to a row lead associated with the respective row, and the circuit arrangement, with respect to the columns, transmitting a one-out-of-m code signal and, with respect to the rows, a one-out-of-n code signal, wherein the improvement comprises:

one row flip-flop for each row, each row flip-flop including one reset, one set input, and an output associated with the set input, said set input being connected to the respective row lead;

one first make contact type electronic switch for each row flip-flop connecting the set input thereof to the output associated with the set input and having a control input;

a first NOR-gate having an output and n inputs which are arranged at the output of each row flip-flop associated with the respective set input;

a first differentiating circuit having an output and an input connected to the output of the first NOR-gate, and which is triggered by a negatively directed pulse edge;

an inverter stage having an output and an input, said inverter input being connected to the output of the first NOR-gate and said inverter output being connected to all control inputs of the first electronic switches;

one column flip-flop means for each column, each column flip-flop means having one reset input and two set inputs not conditioning one another of which the first one is connected to the respective column lead and the second one is connected to the output of the first NOR-gate with the column flip-flop means reset input being connected to the output of the first differentiating circuit, each column flip-flop means also having an output associated in common with the two set inputs;

one second make contact type electronic switch for each column flip-flop means, connecting the first set input thereof to the output associated in common with the two set inputs, and having a control input connected to the output of the first NOR-gate;

a second NOR-gate having an output and m inputs applied to the respective first set input of the column flip-flop means;

a second differentiating circuit having an input connected to the output of the second NOR-gate, and an output connected to all reset inputs of the row flip-flops, said second differentiating circuit being triggered with the aid of a positively directed pulse edge; and a highly resistive termination of each column lead, whereby the code signals are provided at the outputs of the respective row flip-flop and column flip-flop means.

2. A circuit arrangement for an input keyboard comprising:

first switch means for selectively connecting one of m-columns to one of n-rows;

means associated with each column and each row for storing a signal associated with each column and row;

second switch means for switching said stored signals between an input and output of each of said storing means;

first logic means for providing NOR logic from the outputs of said row storing means, said NOR logic applied to said second switch means for switching of said row storing means through a means for inverting, said NOR logic being further applied to said column storing means and to said second switch means and to said column storing means through a first differential circuit for switching of said column storing means; and second logic means for providing NOR logic from the m-columns, said NOR logic applied to said row storing means through a second differential circuit, where the keyboard signal may be derived from the outputs of said storage means.

3. The circuit of claim 2 wherein said first switch means upon actuation connects a column lead associated with a respective column to a row lead associated with a respective row.

4. The circuit of claim 3 wherein the column lead transmits a one-out-of-m code signal and the row lead transmits a one-out-of-n code signal.

5. The circuit of claim 2 wherein said row storing means comprises a plurality of flip-flops each having a set input and a reset.

6. The circuit of claim 2 wherein said column storing means comprises a plurality of flip-flop means each having two set inputs and a reset.

7. The circuit of claim 2 wherein said second switch means for switching includes a plurality of control inputs.

8. The circuit of claim 7 wherein said first logic means NOR logic as applied through said means for inverting is connected to said control inputs of said second switch means for switching of said row storing means.

9. The circuit of claim 6 wherein said first logic means NOR logic as applied through said first differential circuit is applied in said resets.

10. The circuit of claim 7 wherein said first logic means NOR logic is applied to said control inputs of said second switch means for switching said column storing means.

11. The circuit of claim 5 wherein said second logic means NOR logic as applied through said second differential circuit is applied to said reset of each said row storing means flip-flops.

12. A circuit arrangement for an input keyboard comprising:

first means for switching arranged in m-columns and n-rows, each of said first switching means connecting a respective row with a respective column;

means for each column and each row for storing a signal associated with each column and each row, each said storing means having a set input and a reset;

second switch means for switching said stored signal between an output and said input of each of said storing means;

first means for providing NOR logic from the outputs of said row storing means, said NOR logic applied to said second means for switching of said row storing means through an inverter, applied to said reset of said column storing means through a first differential circuit, and applied to said second means for switching of said column storing means and said set input of said column storing means; and second means for providing NOR logic from the m-columns, said second means NOR logic applied to said reset of said row storing means through a second differential circuit, whereby the keyboard signals may be derived from the outputs of said storing means.

* * * * *